Jan. 12, 1971 J. L. HUTSON 3,555,372

SEMICONDUCTOR BILATERAL SWITCHING DEVICE

Filed Jan. 2, 1969

JEARLD L. HUTSON
*INVENTOR*

Kanz, Glaser & Harwood

*ATTORNEY*

United States Patent Office 3,555,372
Patented Jan. 12, 1971

3,555,372

SEMICONDUCTOR BILATERAL SWITCHING DEVICE

Jearld L. Hutson, 907 Newberry, Richardson, Tex. 75080

Filed Jan. 2, 1969, Ser. No. 788,433
Int. Cl. H01l 9/00
U.S. Cl. 317—234 10 Claims

ABSTRACT OF THE DISCLOSURE

A semiconductor bilateral switch device comprises a relatively thick wafer of material of one electrical conductivity type and relatively high resistivity, a pair of regions of the same electrical conductivity type, but of lower resistivity formed in opposite faces of the wafer, and another pair of regions of an opposite electrical conductivity type formed in opposite faces of the wafer within the first mentioned pair of regions, respectively, with electrodes attached to the last mentioned regions. The device exhibits a negative resistance characteristic for currents above a predetermined breakdown current, and is employed to apply a control signal to semiconductor power switches.

Development of semiconductor power switches has, in most instances, necessitated the development of complementary devices to trigger the power switches. One of the most frequently used devices for this purpose is known as the Diac, which is a bilateral trigger device having a basic transistor structure. This device is well known and comprises three successively contiguous regions of alternate electrical conductivity types within a semiconductor body which define a pair of junctions therein. The device has two conduction terminals, but no third or base lead. The characteristic curve of the device shows that the device exhibits a negative resistance characteristic above a given switching current, which negative resistance characteristic extends over the necessary operating range of currents required for control signals. Upon attaining a certain voltage across the device, the device switches to its negative resistance operating range to conduct a relatively high current at low voltages above the switching current. This characteristic permits the application of a control signal to semiconductor power switches. Normally, the device is manufactured to have a breakover or breakdown voltage at or about 30 volts, which is a typical value for control circuits employed with semiconductor power switches.

In order to manufacture bilateral trigger devices of the type described above, it has been necessary to use very thin semiconductor wafers in the order of only about 5 mils in thickness with a low resistivity. This greatly reduces the yield that can be achieved in mass production runs because of the large breakage factor of wafers due to the thinness thereof. Moreover, only relatively small diameter semiconductor slices can be used because of the high breakage factor. These devices are diffused to create the junctions therein and very little error can be tolerated in the depth of these diffusions. All of these problems and others have hampered the industry in its ability to manufacture these types of devices on a mass production basis with high yields.

The present invention contemplates a bilateral trigger device of the general type above described that has essentially the same operating characteristics, such as breakdown voltage and switching current, for example, while at the same time eliminating the above problems so as to enable the reliable mass production of these devices economically with a very high yield factor. This is accomplished by employing relatively thick semiconductor wafers of relatively high resistivity and providing regions therein by diffusion so as to yield the same operating characteristics of the more conventional Diac. In brief, a relatively thick semiconductor wafer is employed as the starting material and a dopant that determines the same electrical conductivity type as the original wafer is diffused into opposite faces of the wafer to lower the resistivity in order to control the breakdown voltage of the trigger. Thereafter, another dopant that determines the opposite electrical conductivity type is diffused into the opposite faces of the wafer to create the rectifying junctions required. The diffusions of the dopants are carried out in such a manner as to yield a controllable breakdown voltage at the desired value. Thus by using thick starting wafers, the breakage factor is essentially eliminated and much larger diameter wafers can be used, thereby increasing the number of individual devices that can be manufactured per wafer.

Many other objects, features and advantages will become readily apparent from the following detailed description of the invention when taken in conjunction with the appended claims and the attached drawing wherein:

Figure 1:
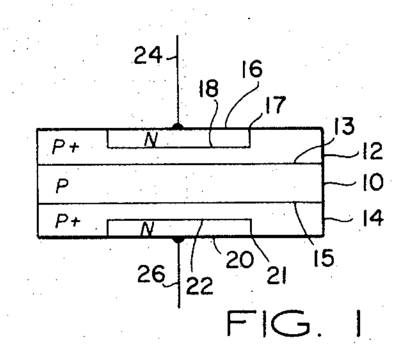
FIG. 1 is a schematic, vertical section of a semiconductor wafer embodying the present invention, in which planar technology is employed.

FIG. 1 illustrates one embodiment of the device of the invention as a vertical sectional view taken through a semiconductor wafer, wherein planar technology is employed. A relatively thick wafer 10, such as P-type conductivity silicon having a thickness of from about .007–.020 inch and a resistivity of from about 7–14 ohm centimeters is used as the starting material. However, material in the range of from about .5 ohm-cm. to several thousand ohm-cm. can be used. It has already been noted that one of the prime objectives of the invention is to use thick semiconductor wafers so that breakage is greatly reduced or eliminated, and to do so, a high resistivity material must be used to achieve a high enough lifetime and mobility of the carriers within the wafer. Otherwise, the carriers would recombine within the material before they could cross the width thereof.

A suitable dopant that determines the same electrical conductivity type as the starting material is diffused into opposite faces of the wafer to form essentially identical regions 12 and 14 that have a considerably higher electrical conductivity than the starting material. These regions are shown to have boundaries 13 and 15, respectively, with the original starting material, but these boundaries are for illustrative purposes only and do not constitute rectifying junctions. Subsequent to this diffusion, another dopant that determines the opposite electrical conductivity type is diffused into the opposite faces of the wafer to form N-type conductivity regions 16 and 20 that form rectifying junctions with regoins 12 and 14, respectively. Planar diffusion techniques, the technology of which is well known, is employed in these diffusions so that the junctions between these regions are brought to the surface of the device. Therefore, there is a surface junction portion 17 between regions 16 and 12 that intersects the surface of the device on one face thereof and a major portion 18 beneath the surface that is substantially parallel therewith. Similarly, there is a surface junction portion 21 between regions 20 and 14 that intersects the opposite face of the slice and a major portion 22 that is beneath the surface. Electrical contacts or electrodes 24 and 26 are attached to regions 16 and 20, respectively, that serve as conduction terminals for the device. It will be understood that the exposed junctions of the device can be passivated with glass or oxide, or both, but such passivation and layers have been eliminated in the drawing for purposes of clarity.

Figure 2:
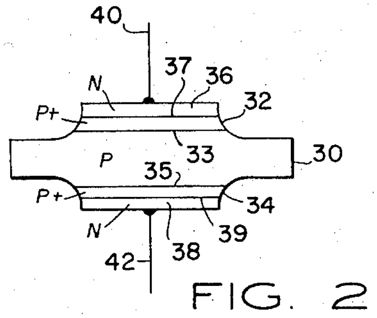
FIG. 2 is a schematic, vertical section of a semiconductor wafer embodying the present invention wherein the device is of a mesa construction.

FIG. 2 is a similar view of another embodiment of the invention in which the device is of mesa construction, and to which reference will be had hereinafter.

Figure 4:
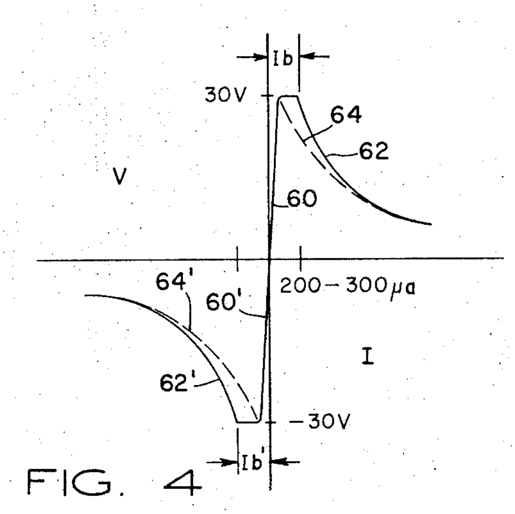
FIG. 4 is a graphical representation of the V–I characteristics of the device.
Figure 3:
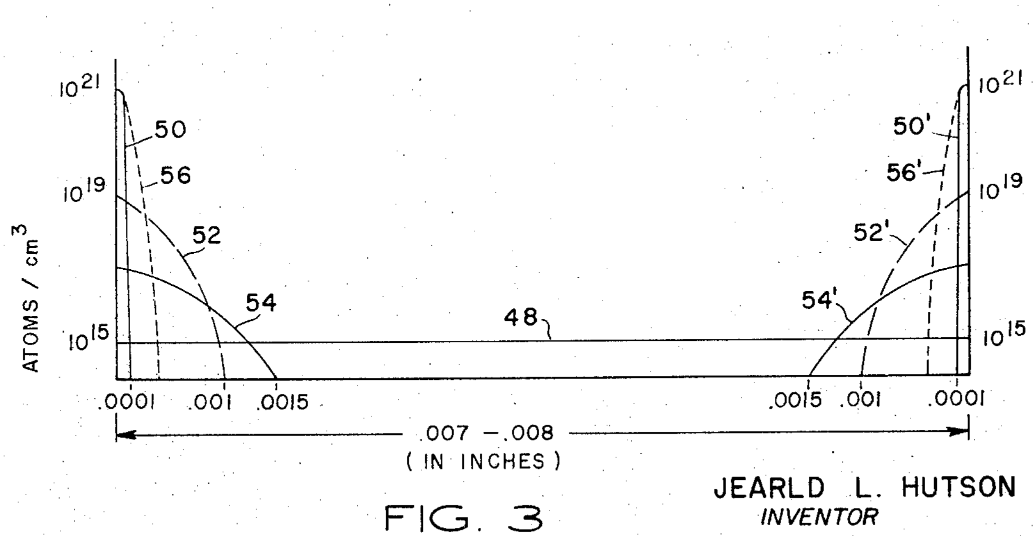
FIG. 3 is a graphical representation of the dopant carrier concentrations within the semiconductor wafer.

There is shown in FIG. 3 a graphical representation of the carrier concentrations of the various dopants as a function of depth within the wafer for the device of FIG. 1. In addition, FIG. 4 is a graphical representation of the V–I characteristics of the device of FIG. 1, wherein reference will be had to both of these FIGS. in conjunction with the process for manufacturing the device. It will be appreciated that the electrical conductivity types for this device can be interchanged, and that alternative dopants can be employed, but specific reference will be had to particular conductivity types and dopants in the specific description. It should also be understood that many devices as shown in FIG. 1 are fabricated within a single semiconductor wafer at one time, and that after the diffusions are completed, the wafer is scribed and broken to separate out the individual devices.

A P-type conductivity silicon wafer having a thickness in the order .007–.012 inch and from 7–14 ohm centimeter resistivity is employed as a starting material. This starting material is typically doped with boron uniformly throughout at a concentration of about $10^{15}$ boron atoms/cm.$^3$. The wafer is etched to insure smooth faces or surfaces. The wafer is then oxidized in any suitable manner on the opposite faces thereof and gallium is deposited on the oxidized surfaces thereof fo rabout eight hours to provide a concentration of gallium atoms on the surfaces of from about $10^{17}$–$10^{19}$ gallium atoms per cm.$^3$. This deposition step is conventional for gallium diffusions and is well known. Thereafter, the wafer is removed from the gallium source and the gallium is diffused into the wafer for about 24 hours at approximately 1200° C. to redistribute the gallium within the wafer.

Referring to FIG. 3, the original boron concentration within the semiconductor slice is represented by curve 48 throughout the thickness of the wafer at a concentration of about $10^{15}$ boron atoms per cm.$^3$. The original deposition of the gallium is represented by curves 52 and 52′ (gallium being deposited on both surfaces of the wafer) wherein a surface concentration of about $10^{19}$ gallium atoms/cm.$^3$ is established at the surfaces of the wafer, and thereafter the gallium is redistributed in the wafer as shown by curves 54 and 54′ to establish the proper concentration as a function of distance to achieve the desired breakdown voltage. Although the exact concentrations of the dopants at subsurface levels are not measured, the original gallium deposition will establish a concentration something less than $10^{15}$ atoms/cm.$^3$ at about .001 inch subsurface depth. After redistribution, the surface concentration will be somewhat reduced and will establish a concentration something less than $10^{15}$ atoms/cm.$^3$ at about .0015 inch subsurface depth. The gallium concentration within these regions increase the electrical conductivity as P+ regions and is the primary factor that controls the breakdown voltage of the device, wherein the proper concentration and diffusion parameters are determined by measurement of the breakdown voltage of the device.

After the gallium diffusion, windows are etched in the oxide surface over areas where regions 16 and 20 are to be formed. Phosphorus is then diffused through these windows (using conventional techniques) into opposite surfaces of the wafer to establish regions 16 and 20 that form rectifying junctions 18 and 22, respectively, with P+ regions 12 and 14. The phosphorus distribution curves are indicated in FIG. 3 as 50 and 50′ wherein a surface concentration of about $10^{21}$ phosphorus atoms/cm.$^3$ is established. Only a very shallow diffusion is carried out for the phosphorus, wherein the concentration within the slice drops to something less than $10^{15}$ phosphorus atoms/cm.$^3$ at a subsurface depth of about .0001 inch.

Because of the relatively thick wafer user, the electrical resistivity must be relatively high in order to insure a long enough lifetime and mobility for the carriers crossing the slice. However, such a high resistivity determines too high a breakdown voltage. Therefore, the gallium is used to decrease the resistivity within surface portions of the wafer to control the breakdown voltage at the proper value, normally about 30 volts. It will be seen that there are in actuality different breakdown characteristics of junctions 18 and 22 due to the different carrier concentrations over the areas of these junctions. That is to say, junctions 18 and 20 include surface portions 17 and 21, respectively, at which the gallium concentration adjacent thereto is slightly different than along the subsurface portions of these junctions. The effect of this will be more clearly understood from the graphical representation of FIG. 4, which illustrates the V–I characteristics of the device, which characteristics are very nearly the same as that for a conventional Diac device. The device is bi-directional in its conduction and therefore the curve of FIG. 4 shows both the positive and negative quadrants for conduction. A voltage of approximately 30 volts, depending primarily upon the gallium concentration, must be applied across the device to attain the breakdown voltage. When this voltage is attained, breakdown at the surface portions 17 and 21 of the two junctions 18 and 22, respectively, is attained and a small current is conducted. As the current is increased through the device by attempting to raise the voltage thereacross, the subsurface portions of the junctions break down and in continuous fashion throughout the area thereof until the entire junction becomes active. The current at which the entire junction, or substantially all thereof, becomes active is referred to as the berakdown current $I_b$ as shown in FIG. 4 and is typically, for the device of FIG. 1, in the order of 200–300 microamperes. At this point, the device exhibits a negative resistance characteristic throughout the operating range for higher currents as denoted by curve 62 and curve 62′ for reverse currents. Again referring to FIG. 3, it will be seen that the gallium concentration at the surfaces of the wafer as shown by curves 54 and 54′ determine the breakdown voltage of the surface portions of the junction, whereas the gallium concentration at the intersection of curves 50 and 54 (corresponding curves 50′ and 54′), determines the breakdown voltage of the subsurface portions of the junctions. It will also be noted that the difference in breakdown voltage is very small indeed, so as to minimize the breakdown current $I_b$. On the other hand, this particular breakdown voltage difference or breakdown current value can be very accurately and positively controlled by the process of making the device in the peculiar construction described, and is very reproducible. It will be seen that this breakdown current can be varied, primarily by distributing the phosphorus dopant further into the slice by diffusing for a longer period of time. For illustrative purposes only, curves 56 and 56' are shown to indicate diffusion of the phosporus further into the wafer so that the junctions 18 and 20 are formed further within the slice with a consequent lower gallium concentration. This, of course, increases the breakdown current $I_b$. Typically, the breakdown current $I_b$ should not exceed 300 microamperes for most applications.

It has been found that the considerably large thickness of the wafer does not appreciably increase the forward voltage drop of the device within the negative resistance operating range as compared to a conventional Diac device, even though the resistivity is relatively high. On the contrary, the resistivity determines a sufficient lifetime period within the wafer to prevent recombination of the carriers before the carriers traverse the thickness thereof. The forward voltage drop of the device of FIG. 1 in the negative resistance range is typically in the order of 20–25 volts. Also, the resistivity of the original wafer can be quite high as noted above, without affecting the operating characteristics, as the resistivity is modulated as in a high resistivity base region of a transistor.

It will be pointed out that for the particular electrical conductivity types described using silicon as the material, gallium has been found to be a peculiarly suitable impurity with which to dope the wafer to form regions 12 and 14. The primary reason for this is that excellent and reproducible uniformity of gallium concentration can be achieved, which is very important to accurately control the ultimate operating characteristics of the device.

A mesa type construction of the device can also be employed and has peculiar advantages associated therewith. Normally, however, it is easier to scribe a wafer in which the devices therein have been constructed according to planar techniques as shown in FIG. 1. A mesa type construction embodying the invention is shown in FIG. 2, wherein the material, conductivity types, concentration levels, and other parameters are the same as for the planar device with the exception of those noted hereinafter. An original wafer 30 of P-type conductivity silicon has formed in opposite surfaces thereof regions 32 and 34 having schematically illustrated boundaries 33 and 35, respectively, and which regions are P+ to increase the electrical conductivity of the material. N-type conductivity regions 36 and 38 are formed in regions 32 and 34, respectively, from opposite faces of the wafer to create rectifying junctions 37 and 39, respectively, with these regions. The wafer is etched in a conventional manner to cut through junctions 37 and 39, and it will be seen that the entire surface areas of these junctions are bounded by a constant carrier concentration at subsurface levels within the wafer. It is immaterial whether or not the mesa cut penetrates the boundaries 33 and 35, as these boundaries can be established further into the wafer.

As before the gallium carrier concentration within the wafer at junctions 37 and 39 establishes the breakdown voltage of the device, and that no surface concentration of gallium has any effect on the breakover voltage of the device. As a matter of fact, the relative depths of junctions 37 and 39 with respect to boundaries 33 and 35, respectively, has essentially no effect on the operating characteristics of the device. By establishing the proper gallium concentration at these junctions, the proper breakover voltage can be attained, again about 30 volts as shown in FIG. 4. Once these junctions break down at a very small breakdown current (usually about 200 microamperes), further current increase is not required as in the device of FIG. 1 for the device to exhibit a negative resistance characteristic. Curves 64 and 64' of FIG. 4 illustrate this characteristic for the device of FIG. 2. Thus it will now be apparent that each embodiment shown has peculiar advantages.

Throughout the preceding description, breakdown of the junctions have been referred to. It will be understood from the bilateral characteristic of the device that only one junction breaks down for a particular voltage polarity applied across the conduction terminals, as the other junction will be forward biased.

Although the foregoing description makes reference to specific embodiments of the invention, it will be appreciated that certain modifications and substitutions, which will be apparent to those skilled in the art, can be made without departing from the true scope of the invention. Therefore, it is intended that the invention be limited only as defined in the appended claims.

What is claimed is:

1. A semiconductor bilateral switching device exhibiting a negative resistance characteristic for currents above a predetermined minimum switching current, comprising:

(a) a body of semiconductor material of one electrical conductivity type having a relatively low electrical conductivity, (b) a first pair of spaced apart, substantially identical regions formed in opposite faces of said body having one electrical conductivity type, but of electrical conductivity higher than said body, (c) a second pair of substantially identical regions formed in said opposite faces of said body within said first pair of regions, respectively, forming rectifying junctions therewith, and having electrical conductivity types opposite said one electrical conductivity type, and (d) a pair of electrodes attached to said second pair of regions, respectively, (e) whereby one of said rectifying junctions is reverse biased when a voltage is applied across said pair of electrodes and is caused to break down to cause said device to exhibit a negative resistance characteristic between said pair of electrodes when said voltage causes a predetermined breakdown current to flow across said one of said rectifying junctions.

2. A semiconductor bilateral switching device as set forth in claim 1 wherein the electrical conductivity of said second pair of regions is greater than the electrical conductivity of said first pair of regions.

3. A semiconductor bilateral switching device as set forth in claim 1 wherein said one electrical conductivity type is P-type.

4. A semiconductor bilateral switching device is set forth in claim 1 wherein the rectifying junctions formed between said first and said second pair of regions intersect opposite faces, respectively, of said body.

5. A semiconductor bilateral switching device as set forth in claim 1 wherein portions of said body at both surfaces thereof are cut away at a depth below said rectifying junctions, and the entire areas of said rectifying junctions are at a constant depth beneath said surfaces.

6. A semiconductor bilateral switching device as set forth in claim 1 wherein said body of material comprises P-type conductivity silicon, and said first pair of regions comprises gallium for controlling said higher electrical conductivity.

7. A semiconductor bilateral switching device as set forth in claim 1 wherein said first pair of regions comprises an impurity of said one electrical conductivity type in a concentration adjacent each of said pair of rectifying junctions for providing the breakdown of one of said rectifying junctions at about 30 volts applied across said pair of electrodes.

8. A semiconductor bilateral switching device as set forth in claim 1 wherein said body comprises an impurity in a concentration for providing a voltage drop between said pair of electrodes in a magnitude range of from about 20 volts to about 25 volts in the negative resistance operating range.

9. A semiconductor bilateral switching device as set forth in claim 1 wherein said body of material has a thickness between said opposite faces in a range of from about .005 inch to about .020 inch, and the electrical resistivity of said body of material is from about .5 ohm-centimeter or greater.

10. A semiconductor bilateral switching device as set forth in claim 9 wherein said first pair of regions comprises gallium in a concentration adjacent said pair of junctions in a range from about $10^{17}$ to about $10^{19}$ gallium atoms/cm$^3$ for controlling said higher electrical conductivity thereof.

References Cited

UNITED STATES PATENTS

| | | | |
|---|---|---|---|
| 3,018,423 | 1/1962 | Aarons | 317—234 |
| 3,040,188 | 6/1962 | Gaertner et al. | 317—235X |
| 3,053,998 | 9/1962 | Chynoweth et al. | 317—235X |
| 3,069,604 | 12/1962 | Ruerwein | 317—234 |

JAMES D. KALLAM, Primary Examiner

U.S. Cl. X.R.

317—240